(12) United States Patent
Katayama

(10) Patent No.: US 6,797,554 B2
(45) Date of Patent: Sep. 28, 2004

(54) METHOD OF MANUFACTURING SEMICONDUCTOR INTEGRATED CIRCUIT HAVING CAPACITOR AND SILICIDED AND NON-SILICIDED TRANSISTORS

(75) Inventor: Satoshi Katayama, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 10/101,723

(22) Filed: Mar. 21, 2002

(65) Prior Publication Data
US 2002/0142540 A1 Oct. 3, 2002

(30) Foreign Application Priority Data
Mar. 21, 2001 (JP) .................................... 2001-080289

(51) Int. Cl.⁷ ........................................ H01L 21/8238
(52) U.S. Cl. ...................... 438/210; 438/238; 438/239
(58) Field of Search ............................... 438/210, 238, 438/239, 241, FOR 212

(56) References Cited

U.S. PATENT DOCUMENTS

| | | | |
|---|---|---|---|
| 4,870,115 A | | 9/1989 | Itoh et al. |
| 5,071,784 A | * | 12/1991 | Takeuchi et al. ............ 438/241 |
| 5,554,558 A | * | 9/1996 | Hsu et al. .................... 438/253 |
| 5,631,188 A | * | 5/1997 | Chang et al. ................ 438/253 |
| 5,698,463 A | | 12/1997 | Suga |
| 5,736,421 A | | 4/1998 | Shimomura et al. |
| 5,780,333 A | | 7/1998 | Kim |
| 5,924,011 A | | 7/1999 | Huang |
| 6,083,785 A | | 7/2000 | Segawa et al. |
| 6,103,621 A | * | 8/2000 | Huang ......................... 438/652 |
| 6,107,357 A | | 8/2000 | Hawker et al. |
| 6,143,618 A | * | 11/2000 | Chen et al. .................. 438/396 |
| 6,177,306 B1 | * | 1/2001 | Wu .............................. 438/241 |
| 6,180,462 B1 | | 1/2001 | Hsu |
| 6,200,905 B1 | * | 3/2001 | Pan ............................. 438/706 |
| 6,204,105 B1 | | 3/2001 | Jung |
| 6,242,300 B1 | * | 6/2001 | Wang .......................... 438/241 |
| 6,246,084 B1 | | 6/2001 | Kim |
| 6,333,222 B1 | * | 12/2001 | Kitazawa et al. ........... 438/241 |
| 6,391,702 B1 | * | 5/2002 | Ando .......................... 438/241 |
| 6,436,750 B1 | * | 8/2002 | Dahl ........................... 438/210 |
| 6,483,152 B1 | * | 11/2002 | Kim ............................ 257/379 |
| 2001/0033028 A1 | | 10/2001 | Nakata et al. |

FOREIGN PATENT DOCUMENTS

| | | |
|---|---|---|
| EP | 0 881 668 A2 | 5/1998 |
| EP | 1 245 628 A1 | 11/2001 |

OTHER PUBLICATIONS

World Intellectual Property Organization, Alliedsignal, Inc. Low Dielectric Constant Polyorganosilicon Coatings Generated from Polycarbosilanes.

* cited by examiner

Primary Examiner—Hsien Ming Lee
(74) Attorney, Agent, or Firm—Oliff & Berridge, PLC (57) ABSTRACT

A method of manufacturing a semiconductor integrated circuit including a silicided and non-silicided MOS transistor together with a capacitor is provided. An insulating film for forming a capacitor insulating film and a conductive material film for forming an upper electrode are formed sequentially. A part of the insulating film is used to form the capacitor insulating film, and another part of the same insulating film is used as a salicide block film.

7 Claims, 4 Drawing Sheets

METHOD OF MANUFACTURING SEMICONDUCTOR INTEGRATED CIRCUIT HAVING CAPACITOR AND SILICIDED AND NON-SILICIDED TRANSISTORS

BACKGROUND OF THE INVENTION

1. Field of Invention

The present invention relates to methods of manufacturing integrated circuits comprising MOS transistors together with passive elements such as capacitors and resistors.

2. Description of Related Art

Concomitant with recent trends toward the miniaturization of semiconductor devices, resistance of a diffusion region in the lateral direction tends to increase with the decreases in depth of a p-n junction. For example, in MOS transistors, as source and drain regions become shallower in compliance with the reduction of the gate length, the resistances of the source and drain regions increase. As a result, it becomes difficult to form high-speed transistors.

Accordingly, silicidation techniques in which silicide films are formed on source and drain regions for decreasing the resistance thereof are widely used.

Of various silicidation techniques, the most widely used technique is a so-called self align silicide (salicide) technique. In this technique, after a refractory metal film of Ti or the like is deposited over the entire surface of a semiconductor substrate having source and drain regions and a gate electrode of a MOS transistor, the substrate is heated. A silicidation reaction is carried out only on the source and drain regions and the gate electrode, at which silicon surfaces are exposed. As a result, silicide films are selectively formed only on the source and drain regions and the gate electrode.

On the other hand, a transistor used for an input/output circuit may not be silicided in some cases, for example, to keep a required ESD tolerance. In such cases, after covering transistors which are not silicided with an insulating film (salicide block film), only the remaining uncovered transistors are silicided.

Conventionally, in a CMOS (complementary MOS) process including a step of forming a self-align silicide as described above, methods in which passive elements such as a capacitor element and a resistor element are formed together with MOS transistors have been proposed. In particular, in integrated circuits used for analog applications, those passive elements mentioned above have been frequently used.

For example, U.S. Pat. No. 5,736,421, hereby incorporated by reference in its entirety, discloses a method in which an insulating film used for a capacitor is also used as a salicide block film or sidewall spacers of a MOS transistor. In addition, U.S. Pat. No. 5,780,333, hereby incorporated by reference in its entirety, discloses a method in which an insulating film used for a capacitor and an upper electrode of the capacitor are simultaneously patterned. Various modifications of these methods are also disclosed in, for example, U.S. Pat. Nos. 5,924,011, 6,180,462, 6,204,105, and 6,246,084, hereby incorporated by reference in their entireties.

However, according to the method disclosed in U.S. Pat. No. 5,736,421, the upper electrode of the capacitor is formed after the capacitor insulating film is patterned. Accordingly, the capacitor insulating film may be contaminated or damaged during the patterning. Specifically, organic materials contained in the resist used in the patterning may contaminate the insulating film. Etching or ashing treatment in the patterning may also damage the insulating film. Therefore, the electric properties of the capacitor may be inferior.

In addition, according to the method disclosed in U.S. Pat. No. 5,780,333, the insulating film can be used only as the capacitor insulating film, because it is patterned simultaneously with the upper electrode. Therefore, another insulating film must be formed and then patterned in order to form a salicide block film or sidewall spacers, and therefore, the number of steps is increased.

SUMMARY OF THE INVENTION

In consideration of the problems described above, an object of the present invention is to provide a method for manufacturing a semiconductor integrated circuit in which passive elements having superior electrical properties can be formed using an efficient process.

According to an aspect of this invention, a first exemplary method of manufacturing a semiconductor integrated circuit includes providing a semiconductor substrate having gate electrodes of a first and a second transistor and a lower electrode of a capacitor over a surface of the semiconductor substrate. The surface of the semiconductor substrate has source and drain regions of the first and the second transistors on respective first and second sides of each gate electrode.

The first exemplary method also includes forming an insulating film over the surface of the semiconductor substrate having the gate electrodes and the lower electrode, and forming an upper electrode of the capacitor over the lower electrode. The upper electrode is separated from the lower electrode by the insulating film.

The first exemplary method further includes removing selected parts of the insulating film after forming the upper electrode. The insulating film is removed to expose at least the source and drain regions of the second transistor while retaining remaining parts of the insulating film including those covering the source and drain regions of the first transistor.

Finally, the first exemplary method includes selectively forming silicide films on the exposed source and drain regions of the second transistor.

Preferably, forming a second conductive material film on an entire surface of the insulating film and patterning the second conductive material film forms the upper electrode.

According to the first exemplary method, parts of the insulating film are used as a capacitor insulation film, and other parts of the insulating film are used as a salicide block film. Accordingly, a semiconductor integrated circuit having silicided and non-silicide transistors and a capacitor is efficiently formed over a surface of the same semiconductor substrate by a process flow including a small number of manufacturing steps.

In addition, after the insulating film used as the capacitor insulating film is formed, the conductive material film used as the upper electrode is then formed before patterning the insulating film. Accordingly, the capacitor insulating film is not contaminated, or damaged. Therefore, a capacitor having superior electrical properties can be formed.

As a modification of the first exemplary method, the semiconductor substrate has a resistor in addition to the gate electrodes and the lower electrode. The insulating film is formed over the surface of the semiconductor substrate having the resistor in addition to the gate electrodes and the lower electrode, and a part of the insulating film covering the resistor is retained in the removing step.

In this case, a resistor can be efficiently formed on a surface of the same semiconductor substrate by a process flow including a small number of manufacturing steps.

According to another aspect of this invention, a second exemplary method of manufacturing a semiconductor integrated circuit includes providing a semiconductor substrate having gate electrodes of a first and a second transistor and a lower electrode of a capacitor over a surface of the semiconductor substrate. The surface of the substrate has source and drain regions of the first and the second transistors on respective sides of each gate electrode. The surface of the substrate also has a resistor-forming region.

The second exemplary method also includes forming a first insulating film over the surface of the semiconductor substrate having the gate electrodes, the lower electrode, and the resistor forming region, and forming an upper electrode of the capacitor above the lower electrode and a resistor over the resistor-forming region. The upper electrode is separated from the lower electrode by the first insulating film.

The second exemplary method further includes forming a second insulating film over the surface of the semiconductor substrate having the upper electrode and the resistor, and removing selected parts of the first and the second insulating films. The first and the second insulating films are removed to expose at least the source and drain regions of the second transistor while retaining remaining parts of the insulating films including those covering the source and drain regions of the first transistor and the resistor.

Finally the second exemplary method includes selectively forming silicide films on the exposed source and drain regions of the second transistor.

Preferably, the selected parts of the first and the second insulating films removed in the removing step include a part of the second insulating film covering the upper electrode.

More preferably, the second insulating film is formed to stack on parts the first insulating film covering the source and the drain regions of the first and second transistors.

According to the second exemplary method of manufacturing a semiconductor integrated circuit, a part of a second conductive material film is used as an upper electrode of a capacitor, and another part of the conductive material film is used as a resistor. The part of the conductive material film used as the resistor is not silicided so as to have a high resistance. Accordingly, a semiconductor integrated circuit having silicided and non-silicided transistors, a capacitor, and a resistor can be efficiently formed over a surface of the same semiconductor substrate by a process flow having a small number of manufacturing steps.

According to another aspect of this invention, a third exemplary method of manufacturing a semiconductor integrated circuit includes providing a semiconductor substrate having a gate electrode of a transistor and a lower electrode of a capacitor over a surface of a semiconductor substrate. The gate electrode has sidewalls.

The third exemplary method also includes forming an insulating film over the surface of the semiconductor substrate having the gate electrode and the lower electrode, and forming an upper electrode of the capacitor above the lower electrode. The upper electrode is separated from the lower electrode by the insulating film.

The third exemplary method further includes anisotropically etching the insulating film after forming the upper electrode to form spacers on the sidewalls of the gate electrode.

Preferably, forming a conductive material film on an entire surface of the insulating film and patterning the conductive material film forms the upper electrode. More preferably, the conductive material film is patterned using a mask pattern and the anisotropically etching of the insulating film is performed using the same mask pattern.

According to the third exemplary method of manufacturing a semiconductor integrated circuit, a part of the first insulating film is used as a capacitor insulating film, and in addition, other parts of the first insulating film are used as sidewall spacers. Accordingly, a semiconductor integrated circuit including a transistor having sidewall spacers and a capacitor can be efficiently formed on a surface of the same semiconductor substrate by a process flow including a small number of manufacturing steps.

According to still another aspect of this invention, a fourth exemplary method of manufacturing a semiconductor integrated circuit includes providing a semiconductor substrate having gate electrodes of a first and a second transistor and a lower electrode of a capacitor over a surface of the semiconductor substrate. The gate electrodes have respective sidewalls, and the surface of the substrate has source and drain regions of the first and the second transistors on respective sides of each gate electrode.

The fourth exemplary method also includes forming a first insulating film over the surface of the semiconductor substrate having the gate electrodes and the lower electrode, and forming an upper electrode of the capacitor above the lower electrode. The upper electrode is separated from the lower electrode by the first insulating film.

The fourth exemplary method further includes anisotropically etching the first insulating film to form spacers on the respective sidewalls of the gate electrodes, forming a second insulating film over the surface of the semiconductor substrate after forming the spacers, and removing selected parts of the second insulating film. The selected parts of the second insulating film is removed to expose at least the source and drain regions of the second transistor while retaining remaining parts of the second insulating film including those covering the source and drain regions of the first transistor.

Finally, the fourth exemplary method includes selectively forming silicide films on the exposed source and drain regions of the second transistor.

Preferably, the selected parts of the second insulating film removed by the removing step includes a part of the second insulating film covering the upper electrode.

According to the fourth exemplary method of manufacturing a semiconductor integrated circuit, a part of the first insulating film is used as a capacitor insulating film, and in addition, other parts of the first insulating film are used as sidewall spacers. In addition, a part of a second insulating film is used as a salicide block film. Accordingly, a semiconductor integrated circuit including a silicided and a non-silicided transistor, and a capacitor can be efficiently formed over a surface of the same semiconductor substrate by a process flow including a small number of manufacturing steps.

DETAILED DESCRIPTION OF PREFERRED EMBODIMENTS

This invention was first disclosed in Japanese Patent Application 2001-80289, hereby incorporated by reference in its entirety.

Hereinafter, embodiments of this invention will be described.

Firstly, a first method for manufacturing a first semiconductor integrated circuit according to this invention will be described referring to FIG. 1.

FIGS. 1A to 1F are schematic cross-sectional views illustrating sequential steps performed in forming the first semiconductor integrated circuit according to the first manufacturing method of this invention.

The semiconductor integrated circuit manufactured by the method shown in FIGS. 1A to 1F includes a first MOS transistor which is not silicided, a second MOS transistor which is silicided, and a capacitor which is a passive element formed on the same semiconductor substrate. Usually, the semiconductor integrated circuit actually includes a plurality of the first MOS transistors, a plurality of the second MOS transistors, and a plurality of the capacitors, although only one of these elements are shown in FIGS. 1A to 1F.

Figure 1A:
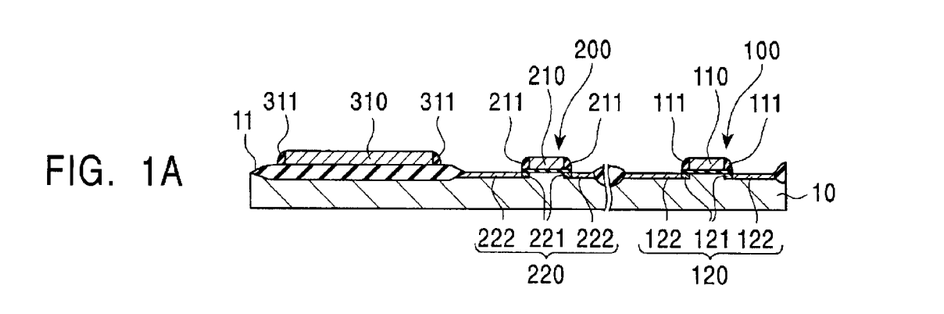
FIGS. 1A to 1F are schematic cross-sectional views illustrating steps for forming a first integrated circuit according to a manufacturing method of a first embodiment of this invention.

First, a field isolation film 11 is formed on the surface of an isolation region on a semiconductor substrate (silicon substrate) 10 shown in FIG. 1A. Areas at which the field isolation film 11 is not formed are active regions in which MOS transistors are formed. A passive element is formed over the isolation region, i.e., directly on the field isolation film 11 or above the field isolation film 11 with another insulating film provided over the field isolation film 11.

Although not shown in the figure, a structure including a p-well, an n-well, and the like is also formed in the surface of the semiconductor substrate 10 when necessary.

A gate dielectric film is formed on the surface of the semiconductor substrate 10 exposed in the active region. On the surface of the semiconductor substrate 10 on which the field isolation film and the gate dielectric film are formed, a first polycrystalline silicon film is formed as a first conductive material film. The polycrystalline silicon film may be formed by, for example, a chemical vapor deposition (CVD) using $SiH_4$ as a source gas. An impurity such as phosphorus is doped in the polycrystalline silicon film to lower the resistance of the polycrystalline silicon film. Thereafter, by patterning the first polycrystalline silicon film, gate electrodes 110 and 210 of a first and a second MOS transistor, and a lower electrode 310 of a capacitor are formed.

Subsequently, in order to form a LDD (lightly doped drain) structure, an impurity is implanted in the surface of the silicon substrate 10 by using the gate electrodes 110 and 210 as masks. As a result, source and drain diffusion regions 121 and 221 are formed.

Subsequently, an insulating film composed of silicon oxide or the like is formed over the entire surface of the semiconductor substrate so as to cover the diffusion regions and the gate electrodes 110 and 210. Next, anisotropical etching using a reactive ion etching method is performed on this insulating film. By this etching, parts of the insulating film are left on both sidewalls of the gate electrodes 110 and 210 so as to form sidewall spacers 111 and 211. In this step, spacers 311 are simultaneously formed on the sidewalls of the lower electrode 310.

Next, by using the sidewall spacers 111 and 211 and the gate electrodes 110 and 210 as masks, an impurity is heavily implanted to form highly doped source and drain diffusion regions 122 and 222. Accordingly, source and drain regions 120 and 220 of the first and the. second MOS transistors 100 and 200 composed of the shallow diffusion regions 121 and 221 and the highly doped diffusion regions 122 and 222 are formed as shown in FIG. 1A.

Figure 1B:
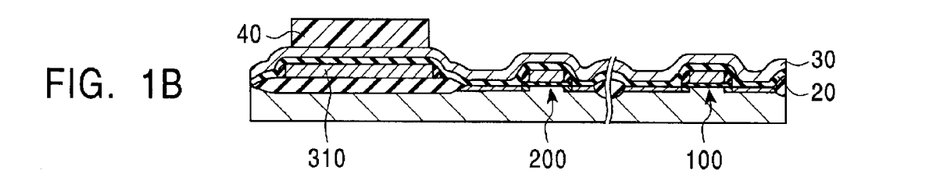

Next, an insulating film 20 composed of $SiO_2$ or the like, for example, shown in FIG. 1B is formed by, for example, a CVD method. This insulating film covers the source and drain regions and the gate electrodes of the first and the second MOS transistors 100 and 200 and the lower electrode 310 of the capacitor. As described later in this specification, a part of this insulating film 20 is used as a salicide block film, and another part of this insulating film 20 that is positioned over the lower electrode 310, is used as a capacitor insulating film.

Next, without performing a process such as photolithography or etching, a second polycrystalline silicon film 30 is formed on the entire surface of the insulating film 20 as a second conductive material film. At least a part of the second polycrystalline silicon film 30, which is located above the lower electrode 310, is doped by an impurity so as to decrease the resistance of the part of the second polycrystalline silicon film 30. Subsequently, a resist mask 40 is provided on a part of the polycrystalline silicon film 30 above the lower electrode 310 as shown in FIG. 1B.

Figure 1C:
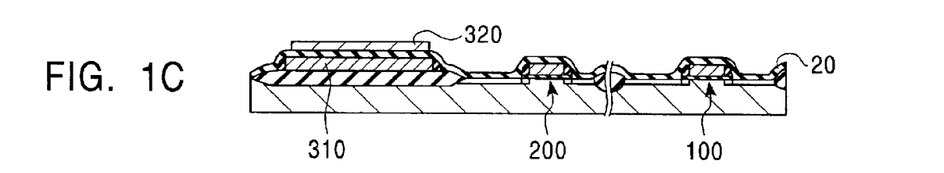

Next, the second polycrystalline silicon film 30 is etched by using this resist mask 40 so as to remove selected parts of the polycrystalline silicon film 30 while retaining other parts of the polycrystalline silicon film 30 above the lower electrode 310, as shown in FIG. 1C. This configuration forms an upper electrode 320 of the capacitor. As a result, the capacitor 300, composed of the lower electrode 310 and the upper electrode 320 and the part of the insulating film 30 between the lower and the upper electrodes, is formed. That is, the part of the insulating film 20 covering the lower electrode 310 is used as the capacitor insulating film.

In the step described above, etching conditions are set so that the insulating film 20 provided on the first and the second MOS transistors 100 and 200 is not completely removed.

As described above, after the insulating film 20 used as the capacitor insulating film is formed, the polycrystalline silicon film 30, which is a conductive material film for forming the upper electrode, is formed without performing a process such as photolithography or etching. Accordingly, the insulating film 20, used as the capacitor insulating film, is not contaminated by an organic material contained in the resist. In addition, the damage such as the decrease in the thickness by etching or ashing is not introduced in the insulating film. Therefore, a capacitor having superior electrical properties can be formed.

Unconventional processes, for example, sequential forming of the insulating film 20 and the polycrystalline silicon film 30 in a same chamber is not necessary. After the insulating film 20 is formed over the semiconductor substrate in an insulating film forming apparatus, the semiconductor substrate is brought out therefrom and is then placed in a clean room. Then, the semiconductor substrate may be placed in a polycrystalline film forming apparatus so as to form the polycrystalline silicon film 30 on the insulating film 20. When necessary, between the steps of forming the insulating film 20 and the polycrystalline silicon film 30, a step of measuring a thickness, a cleaning step, or the like may be performed.

In addition, for example, a heat treatment in order to improve the film properties of the insulating film 30 may be performed before forming the polycrystalline silicon film 30. Even in the case described above, it is considered that the forming of the insulating film 20 and the polycrystalline silicon film 30 are sequentially performed in that order.

However, a step such as a photolithography step or an etching step, which may contaminate or damage the insulating film should not be performed between the steps of forming the insulating film 20 and the polycrystalline silicon film 30. At least a step of patterning the insulating film 20 should not be performed between the steps described above, and a conductive material film 30 such as the polycrystalline silicon film 30 is preferably formed on the entire surface of the insulating film 20.

In the first semiconductor integrated circuit, the second MOS transistor 200 is generally used for signal processing in the semiconductor integrated circuit. Therefore, the second MOS transistor is silicided to decrease the source and drain resistance and the gate resistance. In this first embodiment for forming the first semiconductor integrated circuit, subsequently, a step of silicidizing the source and drain regions and the gate electrode of the second MOS transistor 200 is performed.

On the other hand, the source and drain regions of the first MOS transistor 100, which is used in an I/O circuit, should not preferably be silicided to keep a high breakdown voltage.

Figure 1D:
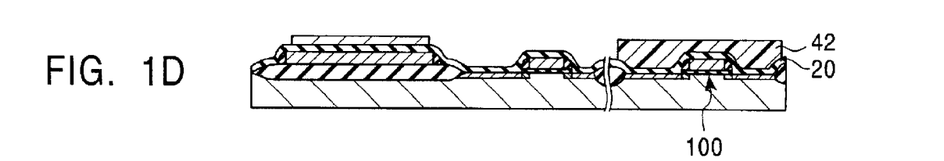
Figure 1E:
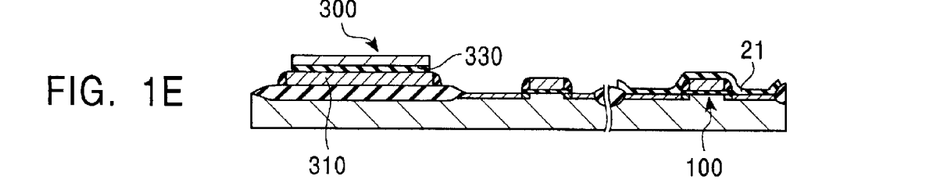

Accordingly, a part of the insulating film 20 covering the first MOS transistor 100 is used as a salicide block film. This part of the insulating film 20 is covered with the resist mask 42 as shown in FIG. 1D. Next, the insulating film 20 is etched using the same resist mask 42. Thereby, parts of the insulating film 20 covering the source and drain regions 220 (more precisely, the highly doped source and drain diffusion regions 222) and the gate electrode 210 of the second MOS transistor 200 is removed, while the part of the insulating film 20 over the source and drain regions 120 and the gate electrode 110 of the first MOS transistor 100 is retained.

The insulating film 20 covering the source and drain regions 120 and the gate electrode 110 of the first MOS transistor 100 is used as a salicide block film 21 in the following step.

Figure 1F:
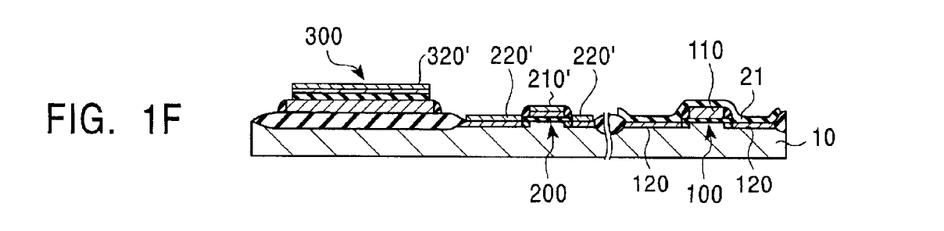

Subsequently, as a silicidation step, a refractory metal film such as a titanium film is deposited over the entire surface of the semiconductor substrate by, for example, sputtering. Next, by performing heat treatment, the silicon surface, which is not covered by the salicide block film 21, is silicidized by a reaction with the titanium film. That is, as shown in FIG. 1F, silicide films 210' and 220' are formed on the upper surfaces of the gate electrode and the source and drain regions (more precisely, highly doped source and drain diffusion layers) of the second MOS transistor 200, respectively. At the same time, the first MOS transistor 100, which is protected by the salicide block film 21, is not silicidized, and high breakdown voltages of the gate electrode 110 and the source and drain regions 120 can be maintained.

Subsequently, unreacted titanium film on the salicide block film 21 is removed by etching using, for example, a $H_2O_2$–$H_2SO_4$ solution. At the same time, unreacted titanium films on the sidewall spacers 111, 211, and 311 are also removed. Thereafter, a second heat treatment is performed to reduce the resistance of the silicide films 210' and 220'. In this first embodiment, as shown in FIG. 1F, the upper electrode of the capacitor element is also silicidized, so that a titanium silicide film 320' is formed thereon. Therefore, the capacitor has a low parasitic resistance.

As described above, in the method for manufacturing the first semiconductor integrated circuit according to the first embodiment, the part of the insulating film 20 is used as the capacitor insulating film 330 of the capacitor 300. In addition, the other part of the insulating film 20 is used as the salicide block film 21. Accordingly, the second MOS transistor 200 having a low resistance, the first MOS transistor 100 having a high breakdown voltage, and the capacitor 300 can be efficiently formed on the surface of the same silicon substrate 10 by a process flow including a small number of manufacturing steps.

As a method for forming the insulating film 20, among the CVD methods mentioned above, a so-called HTO (high temperature oxide) method in which a silicon oxide film is deposited at approximately 750° C. or higher using $SiH_4$ and $N_2O$ as source materials is suitably used. The thickness is appropriately determined in the range of, for example, 10 to 100 nm in accordance with a required capacitance. Even when the thickness is decreased to about 10 nm, the effect of the salicide block film can be still obtained.

Other formation methods may also be used. An insulating film other than a silicon oxide film, such as a silicon nitride film, an alumina film, or a tantalum oxide film, may also be used. A partly nitrided silicon oxide film formed by depositing a silicon oxide film by a CVD method followed by a heat treatment in a nitriding atmosphere may also be used as the insulating film.

In this first embodiment, the gate electrodes of the first and the second MOS transistors are formed of polycrystalline silicon, and the polycrystalline silicon forming the gate electrode of the second MOS transistor is silicided by the reaction with the titanium film. Consequently, the low resistance of the gate electrode of the second MOS transistor can be obtained.

However, the gate electrode may also be formed with other conductive materials. For example, when the gate electrode is formed by patterning a layered film composed of a tungsten film stacked on a polycrystalline silicon film with a tungsten nitride film interposed therebetween, a low resistance gate electrode can be obtained without the silicidation. In this case, silicidation by the reaction with a titanium film may only be performed for the source and drain regions of the second MOS transistor (and if necessary, for the upper electrode of the capacitor).

Next, referring to FIG. 2, a modification of the method of manufacturing the first semiconductor integrated circuit according this invention will be described.

Figure 2:
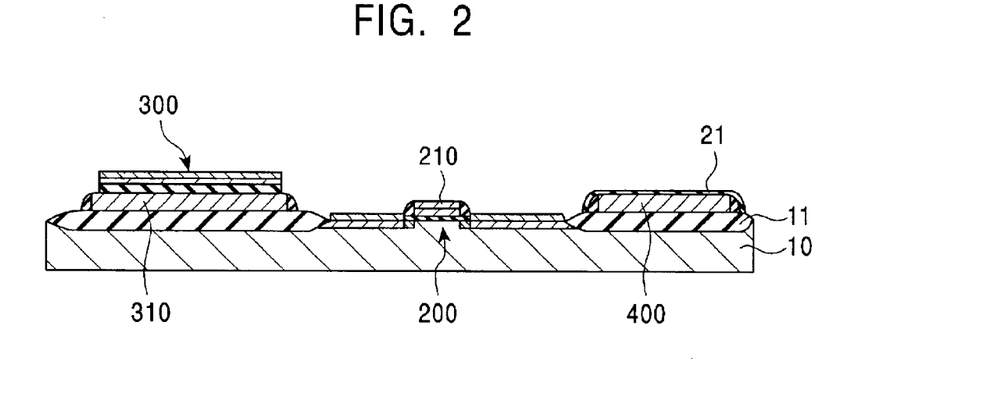
FIG. 2 is a cross-sectional view illustrating a modification of the manufacturing method of the first embodiment of this invention.

FIG. 2 is a cross-sectional view illustrating a step, corresponding to the step shown in FIG. 1F, according to a modification of the manufacturing method of the first embodiment of this invention.

The method of manufacturing the integrated circuit shown in FIG. 2 forms the second MOS transistor 200 which is silicided, the capacitor 300 which is a passive element, and a resistor 400 which is also a passive element over the surface of the same silicon substrate 10.

In this manufacturing method, when the first polycrystalline silicon film formed on the silicon substrate 10 is patterned, in addition to the gate electrode 210 of the second MOS transistor and the lower electrode 310 of the capacitor, the resistor 400 is also formed on the field isolation film 11.

The polycrystalline silicon film forming the resistor 400 is lightly doped in a step different from that performed for the gate electrode of the second MOS transistor 200 and the lower electrode 310 of the capacitor. Accordingly, a high resistance of the resistor 400 is maintained.

Subsequently, the steps described in the first embodiment form the integrated circuit. As shown in FIG. 2, the resistor 400 is also covered with the insulating film 20, and the part of the insulating film formed on and covering the resistor 400 is used as the salicide block film 21. As a result, the resistor 400 is not silicided, and hence, a high resistance can be maintained.

Consequently, in this modification, in addition to the second MOS transistor 200 having a low resistance and the capacitor 300, the resistor 400 can be efficiently formed on the surface of the same silicon substrate 10 by a process flow including a small number of manufacturing steps.

Next, referring to FIGS. 3A to 3C, a method of manufacturing a second semiconductor integrated circuit according to a second embodiment of this invention will be described.

Figure 3A:
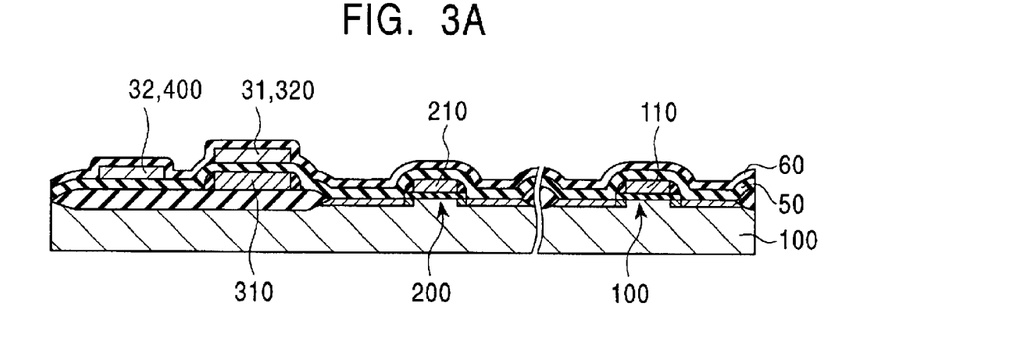
FIGS. 3A to 3C are cross-sectional views illustrating sequential steps performed in forming a second integrated circuit according to a manufacturing method of a second embodiment of this invention.
Figure 3B:
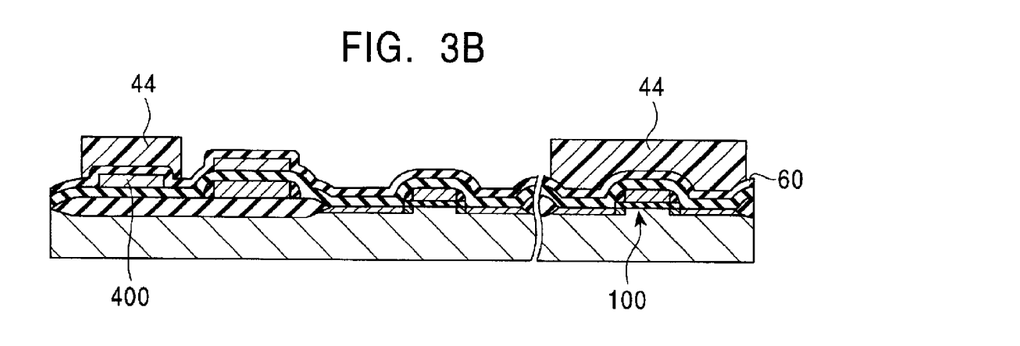
Figure 3C:
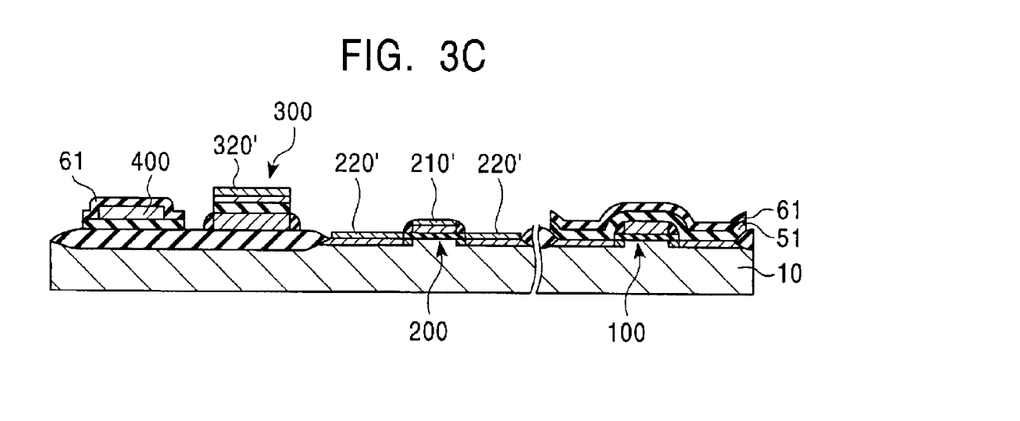

FIGS. 3A to 3C are cross-sectional views illustrating sequential steps performed in forming the second semiconductor integrated circuit according to the manufacturing method of the second embodiment of this invention.

The method for manufacturing the second integrated circuit according to the second embodiment shown in FIGS. 3A to 3C, forms a first MOS transistor having no silicide films, a second MOS transistor having silicide films, a capacitor and a resistor, which are passive elements on the surface of the same silicon substrate.

In the second embodiment, similar to the first embodiment, the gate electrodes 110 and 210 of the first MOS transistor 100 and the second MOS transistor 200 and the lower electrode 310 of the capacitor are formed over the surface of the silicon substrate 10 shown in FIG. 3A by patterning the first polycrystalline silicon film.

In this embodiment, a resistor, which is a passive element, is also formed in the semiconductor integrated circuit in addition to the capacitor. Therefore, a resistor-forming region, for forming the resistor, is provided in a part of an isolation region on the surface of the semiconductor substrate.

Subsequently, after forming the sidewall spacers, a first insulating film (SiO$_2$ film) 50 and a second polycrystalline silicon film are formed in the manner similar to that described in the first embodiment. As described later, a part of this first insulating film 50 is used as a salicide block film, and another part of the first insulating film 50 covering the lower electrode 310 is used as a capacitor insulating film.

Similar to the first embodiment, the second polycrystalline silicon film, which is a conductive material film for forming the upper electrode, is formed sequentially after the formation of the first insulating film 50 used as the capacitor insulating film. Therefore, a capacitor having superior electrical properties can be formed.

Further, in this embodiment, a part of the second polycrystalline silicon film is used to form the upper electrode of the capacitor, and another part of the second polycrystalline silicon film is used to form the resistor. Therefore, a part 31 of the second polycrystalline silicon film above the lower electrode of the capacitor is highly doped with an impurity so that the part 31 has a lower resistance. Also, a part 32 of the polycrystalline silicon film 50 over the resistor-forming region is lightly doped with an impurity so as to maintain a high resistance.

Subsequently, the second polycrystalline silicon film is patterned using a mask pattern (not shown) so as to retain the part 31 above the lower electrode and the part 32 over the resistor-forming region. The part 31 above the lower electrode is used as the upper electrode 320 of the capacitor, and the part 32 is used as the resistor 400.

In the step described above, the etching condition of the second polycrystalline silicon film is set so that the parts of the insulating film 50 on the first and the second MOS transistors 100 and 200 are not completely removed.

In this second embodiment, the second MOS transistor 200 will be silicided. On the other hand, the first MOS transistor 100 and the resistor 400 should not be silicided. In a manner similar to that in the first embodiment, on the first MOS transistor 100, the first insulating film 50 exists, and hence, silicidation can be prevented. However, the upper surface of the resistive element 400 is exposed. Therefore, another insulating film used as a salicide block film is formed to cover the resistor 400.

Accordingly, in this embodiment, as shown in FIG. 3A, a second insulating film (SiO$_2$ film) 60 is formed over the entire surface of the semiconductor substrate so as to cover at least the resistor 400. The second insulating film 60 is formed as described above on the first and the second MOS transistors 100 and 200, and thus the first and the second insulating films 50 and 60 are stacked in this order over the first and the second MOS transistors.

Subsequently, parts of the second insulating film 60 above the first MOS transistor 100 and on the resistor 400 are covered with a resist mask 44 as shown in FIG. 3B, and etching is then performed.

Accordingly, as shown in FIG. 3C, on the first MOS transistor 100, salicide block films 51 and 61 composed of the first and the second insulating films are formed. In addition, the salicide block film 61 composed of the second insulating film is formed on the resistor 400. Subsequently, in a manner similar to that in the first embodiment, a titanium film is deposited over the entire surface of the substrate and heated so that the second MOS transistor 200 is silicided.

As shown in FIG. 3C, silicide films 210' and 220' are formed on the upper surface of the gate electrode and the upper surfaces of the source and drain regions of the second MOS transistor 200, respectively. In contrast, the first MOS transistor 100 and the resistor 400 protected by the salicide block films 51 and 61 are prevented from being silicided. Hence, the resistor can maintain a high resistance. Next, unreacted titanium film on the salicide block films 51 and 61 is removed, and heat treatment is again performed.

As described above, in the method for manufacturing the second semiconductor integrated circuit according to the second embodiment, as in the first embodiment, the part of the first insulating film 50 is used as the capacitor insulating film. In addition, another part of the first insulating film 50 is used as the salicide block film 51, which prevents the first MOS transistor from being silicided.

Further, the part of the first polycrystalline silicon film is used as the upper electrode 320 of the capacitor, and another part of the first polycrystalline silicon film is used as the resistor 400. Also, the second salicide block film 61 composed of the second insulating film 60 and the first salicide block film 51 composed of the first insulating film 50 are simultaneously formed by etching using the resist pattern 44 as a mask.

As a result, the second MOS transistor 200 having a low resistance, the first MOS transistor 100 maintaining a high breakdown voltage, and passive elements of the capacitor 300 and the resistor 400 can be efficiently formed over the surface of the same substrate by a process flow including a small number of manufacturing steps.

In the steps shown in FIGS. 3A to 3C, a salicidation step is performed after the part of the second insulating film 60 covering the upper electrode 320 of the capacitor 300 is removed, and hence, the upper electrode is also subjected to a silicidation process. By decreasing the resistance of the upper electrode by silicidation, a parasitic resistance can be decreased. However, this silicidation is not always necessary. A silicidation step may be performed while the part of insulating film 60 covers the upper electrode 320 so as to prevent the upper electrode 320 from being silicided.

Finally, referring to FIGS. 4A to 4F, a method of manufacturing a third semiconductor integrated circuit according to a third embodiment of this invention will be described.

FIGS. 4A to 4F are cross-sectional views illustrating sequential steps performed for forming the third semiconductor integrated circuit according to the manufacturing method of the third embodiment of this invention.

The method of manufacturing the semiconductor integrated circuits according to the third embodiment shown in FIGS. 4A to 4F forms a first MOS transistor having no silicide films, a second MOS transistor having silicide films, and a capacitor on the surface of the same silicon substrate. In the third embodiment, which is different from the first and the second embodiments, parts of the first insulating film (SiO$_2$ film) for forming sidewall spacers on sidewalls of the first and the second MOS transistors are used as the capacitor insulating films. Hereinafter, this embodiment will be described mainly focusing on the points different from those in the first embodiment.

Figure 4A:
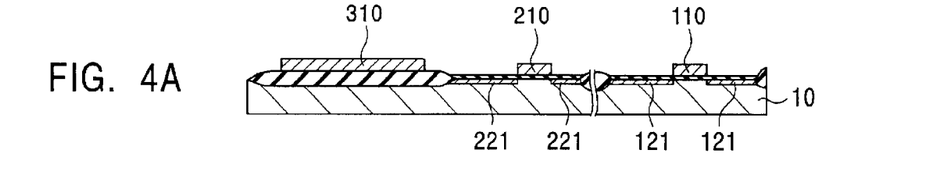
FIGS. 4A to 4F are cross-sectional views illustrating sequential steps performed in forming a third integrated circuit according to a manufacturing method of a third embodiment of this invention.

As is the manufacturing method of the first integrated circuit according to the first embodiment, the first polycrystalline silicon film is formed over the silicon substrate 10. The gate electrodes 110 and 210 of the first and the second MOS transistors, respectively, and the lower electrode 310 of the capacitor are formed by patterning the first polycrystalline silicon film as shown in FIG. 4A. Subsequently, as in the first embodiment, shallow source and drain diffusion regions 121 and 221 are formed.

Figure 4B:
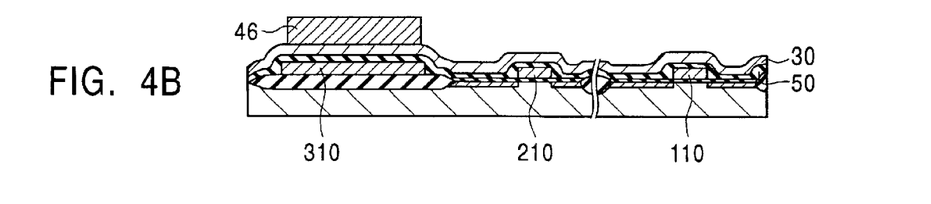

Next, the first insulating film (SiO$_2$ film) 50 and the second polycrystalline silicon film 30 shown in FIG. 4B are formed in a manner similar to that in the first embodiment. As described later in this specification, a part of this first insulating film 50 on the lower electrode 310 is used as a capacitor insulating film. Other parts of the first insulating film 50 on both sidewalls of the gate electrodes 110 and 210 of the first and the second MOS transistors are used as sidewall spacers. Next, a part of the polycrystalline silicon film 30 above the lower electrode 310 is covered with a resist mask 46 as shown in FIG. 4B.

Subsequently, anisotropical etching is performed using the resist pattern 46 as a mask. In this etching step, differently from that in the first embodiment, the first insulating film 50 is also etched in addition to the second polycrystalline silicon film 30. Preferably, the second polycrystalline silicon film 30 is etched with a first etching gas atmosphere, and then the first insulating film 50 is etched with a different etching gas atmosphere, using the same resist pattern 46 as a mask.

In the step described above, the first insulating film 50 over the first and the second MOS transistors is etched so as to only retain parts of the first insulating film 50 which are on the sidewalls of the gate electrodes 110 and 210. The parts of the first insulating film 50 shown in FIG. 4C formed on the sidewalls of the gate electrodes 110 and 210 are used as the sidewall spacers 111 and 211.

Figure 4C:
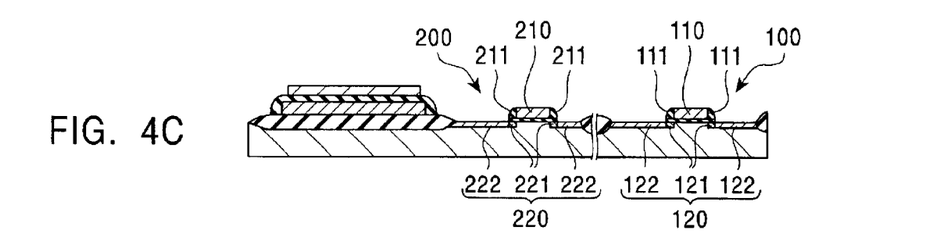

After the formation of the sidewall spacers 111 and 211, the highly doped source and drain regions 122 and 222 of the first and the second MOS transistors are formed. That is, an impurity is heavily doped in the shallow source and drain diffusion regions 121 and 221 using sidewall spacers 111 and 211 and the gate electrodes 110 and 210 as masks, thereby forming the highly doped source and drain diffusion regions 122 and 222.

Also in this embodiment, the second polycrystalline silicon film 30 which is a conductive material film forming the upper electrode is sequentially formed after the formation of the first insulating film 50 which is used as the capacitor insulating film. Therefore, a capacitor having superior electrical properties can be formed.

In this third embodiment, as in the first embodiment, the second MOS transistor 200 and the upper electrode 320 of the capacitor are silicided, and the first MOS transistor is not being silicided. However, the anisotropical etching described above etches the first insulating film 50 and the source and drain regions and the gate electrode of the first MOS transistor 100 is exposed. Therefore, another insulating film used as a salicide block film is formed at least to cover the first MOS transistor.

Figure 4D:
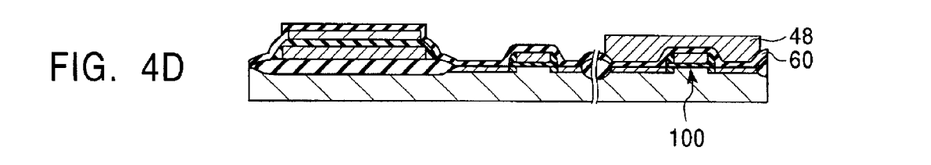

Accordingly, in this embodiment, as shown in FIG. 4D, the second insulating film (SiO$_2$ film) 60 is formed on the entire surface of the semiconductor substrate. Also, after a part of the insulating film 60 covering on the first MOS transistor 100 is covered with the resist mask 48, etching is performed.

Figure 4E:
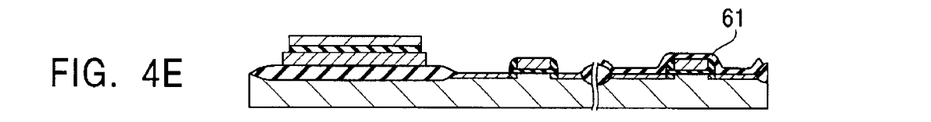

Consequently, on the first MOS transistor 100, as shown in FIG. 4E, the salicide block film 61 composed of the second insulating film is formed.

Figure 4F:
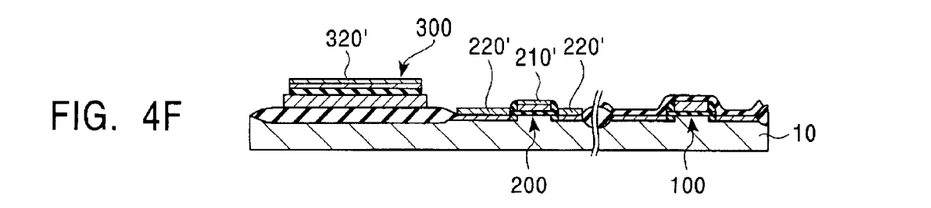

Subsequently, as in the first embodiment, silicidation is performed, and as shown in FIG. 4F, the silicide films 210' and 220' are formed on the upper surface of the gate electrode of the second MOS transistor and the upper surfaces of the source and drain regions thereof, respectively. Also, the silicide film 320' is formed on the upper surface of the upper electrode 320 of the capacitor 300.

As described above, according to the method of manufacturing a semiconductor integrated circuit of the third embodiment, a part of the first insulating film 50 is used as the capacitor insulating film. In addition, other parts of the first insulating film 50 are used as the sidewall spacers 111 and 211. Further, after the salicide block film covering the first MOS transistor is formed, silicidation is performed. Accordingly, the second MOS transistor 200 having a low resistance, the first MOS transistor 100 maintaining a high breakdown voltage, and the capacitor 300 can be efficiently formed over the surface of the same silicon substrate 10 by a process flow including a small number of manufacturing steps.

In the case described above, the first insulating film 50 is formed so as to have a thickness of, for example, approximately 100 nm, which is required as a sidewall spacer. On the other hand, the thickness of the second insulating film 60 can be decreased to about 10 nm.

Heretofore, the first to the third embodiments were described. In each of the embodiments, a part of the polycrystalline silicon film 30 is used for forming the upper electrode 320 of the capacitor 300. In place of the polycrystalline silicon film, other conductive material films may also be used to form the upper electrode. For example, a refractory metal or a refractory metal compound film composed of tungsten, titanium nitride, or the like may also be used for forming the upper electrode 320 of the capacitor 300. When the upper electrode 320 is formed of a metal or metal compound film, voltage coefficient of the capacitor is decreased, and hence, the electrical properties of the capacitor can be further improved.

The same manufacturing methods in the first and the third embodiments may be employed to use the refractory metal of refractory metal compound as the upper electrode. For example, a titanium nitride film may be formed by a sputtering method in place of the second polycrystalline silicon film 30 and etched to form the upper electrode 320 as shown in FIGS. 1B and 1C or in FIGS. 4B and 4C. The silicidation process may also be similarly performed. That is, a titanium film may be deposited also on the surface of the upper electrode formed of titanium nitride. However, the titanium nitride upper electrode does not react with the titanium film, and therefore the silicide films are not formed on the surface of the titanium nitride upper electrode.

As has thus been described, according to the manufacturing method of a semiconductor integrated circuit of this invention, an integrated circuit which comprises a passive element having superior electrical properties can be manufactured by an efficient process.

What is claimed is:

1. A method of manufacturing a semiconductor integrated circuit, comprising:

provided a semiconductor substrate having gate electrodes of a first and a second transistor and a lower electrode of a capacitor over a surface of the semiconductor substrate, the surface of the semiconductor substrate having source and drain regions of the first and the second transistors on respective first and second sides of the gate electrodes;

forming an insulating film over the surface of the semiconductor substrate having the gate electrodes and the lower electrode;

forming an upper electrode of the capacitor above the lower electrode, the upper electrode being separated from the lower electrode by the insulating film;

removing selected parts of the insulating film after forming the upper electrode to expose at least the source and drain regions of the second transistor while retaining remaining parts of the insulating film including those covering the source and drain regions of the first transistor; and selectively forming silicide films on the exposed source and drain regions of the second transistor by depositing a refractory metal film over an entire surface of the semiconductor substrate and reacting the refractory metal film with the exposed source and drain regions of the second transistor, wherein the refractory metal film is deposited directly on the parts of the insulating film covering the source and drain regions of the first transistor.

2. The method according to claim 1, wherein said providing step comprises forming a first conductive material film over the surface of the semiconductor substrate and patterning the first conductive material film to form the gate electrodes and the lower electrode.

3. The method according to claim 1, wherein said forming the upper electrode comprises forming a second conductive material film on an entire surface of the insulating film and patterning the second conductive material film.

4. The method according to claim 3, wherein the second conductive material film is formed on the entire surface of the insulating film with no intervening patterning step after forming of the insulating film.

5. The method according to claim 1, wherein said forming the silicide film comprises depositing a refractory metal film over an entire surface of the semiconductor substrate and reacting the refractory metal film with the exposed source and drain regions of the second transistor and with the upper electrode.

6. The method according to claim 1, wherein the insulating film is formed by a chemical vapor deposition using $SiH_4$ and $N_2O$ as source gasses at a temperature higher than at least 750° C.

7. The method according to claim 1, wherein:

said providing step provides the semiconductor substrate having a resistor in addition to the gate electrodes and the lower electrode;

the insulating film is formed over the surface of the semiconductor substrate having the resistor in addition to the gate electrodes and the lower electrode; and the remaining parts of the insulating film retained in the removing step includes a second part of the insulating film covering the resistor.

* * * * *